(12) United States Patent
Sharp et al.

(10) Patent No.: US 8,308,916 B2
(45) Date of Patent: Nov. 13, 2012

(54) METHOD FOR SIMULTANEOUSLY COATING A PLURALITY OF WORKPIECES

(75) Inventors: David Sharp, Indianapolis, IN (US); Albert Feuerstein, Carmel, IN (US); Scott Cain, Sheridan, IN (US)

(73) Assignee: Praxair S. T. Technology, Inc., North Haven, CT (US)

( * ) Notice: Subject to any disclaimer, the term of this patent is extended or adjusted under 35 U.S.C. 154(b) by 220 days.

(21) Appl. No.: 12/833,226

(22) Filed: Jul. 9, 2010

(65) Prior Publication Data

US 2010/0272894 A1 Oct. 28, 2010

Related U.S. Application Data

(62) Division of application No. 11/446,380, filed on Jun. 5, 2006, now Pat. No. 7,837,843.

(51) Int. Cl.
*C23C 14/34* (2006.01)
*C23C 16/00* (2006.01)

(52) U.S. Cl. ......... 204/192.16; 204/192.12; 204/192.15; 427/248.1; 427/250; 427/251; 427/255.5

(58) Field of Classification Search ............. 204/192.12, 204/192.15, 192.16, 298.15, 298.41, 192.38; 427/248.1, 250, 251, 255.5; 118/728, 729, 118/730, 500, 505
See application file for complete search history.

(56) References Cited

U.S. PATENT DOCUMENTS

| 5,702,574 A | 12/1997 | Foster et al. |
| 5,879,753 A | 3/1999 | Zajchowski et al. |
| 5,997,947 A | 12/1999 | Burns et al. |

FOREIGN PATENT DOCUMENTS

JP 63255369 10/1988

*Primary Examiner* — Rodney McDonald
(74) *Attorney, Agent, or Firm* — Nilay S. Dalal

(57) ABSTRACT

This invention relates to a fixture for use in a physical vapor deposition coating operation which comprises a support structure 14 comprising a circular base member 10, a circular top member 11 opposite the circular base member 10, and a plurality of structural members 12 joining said top member 11 to said base member 10; a plurality of panel members 13 aligned in a vertical direction around the outer periphery of said support structure 14 forming a cylinder structure; said panel members 13 including a plurality of apertures for holding workpieces 19 and 35 to which a coating is to be applied; and said apertures positioned on said panel members 13 so that said workpieces 19 and 35 are aligned in a staggered vertical direction. This invention also relates to a method for simultaneously coating a plurality of workpieces 19 and 35, such as gas turbine compressor blades and vanes, with erosion resistant coatings using the fixture of this invention.

17 Claims, 6 Drawing Sheets

METHOD FOR SIMULTANEOUSLY COATING A PLURALITY OF WORKPIECES

CROSS REFERENCE TO RELATED APPLICATIONS

This application is a divisional of U.S. patent application Ser. No. 11/446,380 filed Jun. 5, 2006 now U.S. Pat. No. 7,837,843.

FIELD OF THE INVENTION

This invention relates to a fixture for use in a physical vapor deposition coating operation and a method for simultaneously coating a plurality of workpieces, such as gas turbine compressor rotor blades and stator vanes, with erosion resistant coatings.

BACKGROUND OF THE INVENTION

Frequently, aircraft, tank and helicopter gas turbine engines are operated in a desert environment where the gas turbine compressor rotor blades and stator vanes are exposed to erosive media such as sand and dust. These erosion effects lead to increased fuel consumption, horsepower loss, higher overall operating temperatures, and can cause damage to compressor and turbine hardware. Erosion resistant coatings such as TiN, TiCN, TiZrN, TiZrCN, TiAlN and TiAlCN, applied by cathodic arc physical vapor deposition, can be used to prolong the life of compressor airfoils in a sand erosion environment. See, for example U.S. Pat. No. 5,071,693.

Physical vapor deposition is a line of sight coating process. Substrates to be coated need to be manipulated in the vapor to achieve uniform coverage. Sections of the substrate that do not require a coating need to be masked adequately.

Turbine compressor airfoils have an airfoil section which extends outward to pump the air into the combustion chamber. The portion of the turbine airfoil opposite the airfoil portion is used to attach the airfoil to the disk or rotor part of the engine, which is not in the flow of the air, and therefore is not in need of protection from erosive effects. This portion of the turbine airfoil often has the shape of a dovetail, which is assembled into dovetail slots on the disk or rotor portion of the engine. Hence, it is frequently referred to as the dovetail.

The walls of the dovetail portion of the turbine airfoil contact the walls of the dovetail slots of the disk or rotor. After a long period of time or rotating at high speeds, the dovetail walls exhibit a fatigue-related phenomenon referred to as fretting. Fretting has been found to be exacerbated by coatings applied to the airfoil portion of the turbine airfoil. Thus, in order to achieve the desired properties in the various portions of the turbine airfoil to maximize the life of the turbine airfoil, it has been necessary to devise methods to properly coat the airfoil portion of the turbine airfoil without affecting the dovetail portion of the turbine airfoil.

Physical vapor deposition is extensively used to apply ceramic thermal barrier coatings on turbine airfoils by electron beam evaporation. Extensive work has been done to design processes and fixturing to apply a uniform coating on a variety of airfoil sizes and shapes.

U.S. Pat. No. 5,997,947 discloses a modular, rotisserie type coating fixture for use in electronic beam physical vapor deposition (EBPVD) coating processes. The fixture includes a support structure and means attached to the support structure for allowing it to be rotated about a first axis. The fixture further includes cassette means within the support structure for holding one or more workpieces to be coated. The cassette means are joined to the support structure by spindles which allow the cassette means to rotate about a second axis substantially parallel to the first axis and thereby allow each workpiece being coated to rotate about its longitudinal axis. The cassette means support each workpiece so that surfaces of the airfoil to be coated are maintained substantially parallel to the coating source.

As indicated above, cathodic arc physical vapor deposition can be used to apply erosion resistant coatings. Cathodic arc physical vapor deposition is, in the first order, a line of sight deposition process. Vapor created by the cathodic arc discharge on the cathode surface propagates basically in a straight line from the cathode surface towards the workpieces. Second order effects in vapor propagation include scattering of the ionized vapor in the chamber gas atmosphere, which creates some throwing power around corners and into cavities and more significantly, electrostatic attraction of the highly ionized vapor, and thus enhanced coating build-up on edges and sharp contours of the workpieces such as airfoil tips and leading and trailing edges of the airfoils. The predominant deposition feature however, when coating the surface of flat workpieces such as the platform and airfoil of compressor blades and vanes, is the line of sight propagation of the vapor. To provide the maximum coating thickness on the workpieces such as the lower part of the airfoil and on the platform, the view between the cathode surface and the workpiece surfaces should not be obstructed.

There continues to be a need in the art for coating fixtures for use in a physical vapor deposition coating operation which allow for simultaneous coating of a plurality of workpieces and which promote the production of high quality coatings. The coating fixtures should permit coating application to only those portions of the workpieces requiring protective coatings while protecting those portions not requiring a protective coating. Further, the coating fixtures should be reusable and relatively inexpensive to fabricate.

SUMMARY OF THE INVENTION

This invention also relates to a method for simultaneously coating a plurality of workpieces comprising:

(i) providing a fixture comprising:

a support structure comprising a circular base member, a circular top member opposite the circular base member, and a plurality of structural members joining said top member to said base member;

a plurality of panel members aligned in a vertical direction around the outer periphery of said support structure forming a cylinder-like structure, said panel members secured on said circular top member and said circular base member;

said panel members including a plurality of apertures for holding workpieces to which a coating is to be applied, said apertures facing outwardly away from said support structure, and said apertures configured for receiving a portion of said workpieces that does not require coating;

said panel members comprising a plurality of plate members, at least some of said plate members providing a barrier for segregating the internal volume of said apertures from the volume external to said apertures and for supporting and securing said workpieces in said apertures; and said apertures positioned on said panel members so that said workpieces are aligned in a vertical direction and a portion of the workpieces that requires coating extends into the volume external to said apertures and a portion of the workpieces that does not require coating is maintained within the internal volume of said apertures so that there is essentially no direct communication between the internal volume of the apertures and the external volume of the apertures across said barrier;

(ii) loading and securing workpieces into said apertures of said panel members;

(iii) positioning said fixture onto a rotatable drive system in a coating chamber having a source of coating material; and (iv) operating the drive system to cause the fixture to rotate and simultaneously coating by physical vapor deposition that portion of said workpieces that extends into the volume external of said apertures.

DETAILED DESCRIPTION OF THE INVENTION

Figure 1:
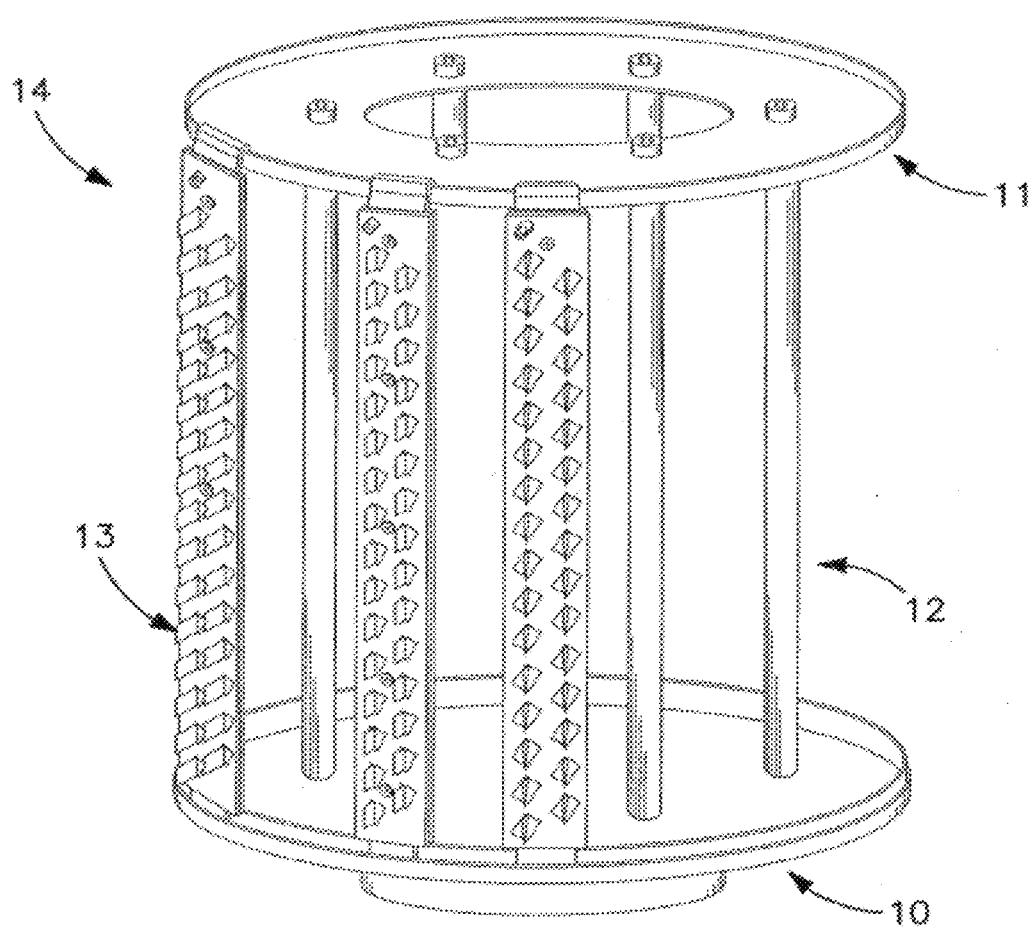
FIG. 1 is a perspective view of a portion of a fixture showing a cylindrical support structure and three panel members secured thereto.

The fixture of this invention comprises: a support structure 14 comprising a circular base member 10, a circular top member 11 opposite the circular base member 10, and a plurality of structural members 12 joining said top member 11 to said base member 10; a plurality of panel members 13 aligned in a vertical direction around the outer periphery of said support structure 14 forming a cylinder-like structure, said panel members 13 secured on said circular top member 11 and said circular base member 10; said panel members 13 including a plurality of apertures for holding workpieces to which a coating is to be applied, said apertures facing outwardly away from said support structure, and said apertures configured for receiving a portion of said workpieces that does not require coating; said panel members 13 comprising a plurality of plate members, at least some of said plate members providing a barrier for segregating the internal volume of said apertures from the volume external to said apertures and for securing said workpieces in said apertures; and said apertures positioned on said panel members 13 so that said workpieces are aligned in a vertical direction and a portion of the workpieces that requires coating extends into the volume external to said apertures and a portion of the workpieces that does not require coating is maintained within the internal volume of said apertures, so that there is essentially no direct communication between the internal volume of the apertures and the external volume of the apertures across said barrier. In a preferred embodiment, the fixture of this invention is specifically designed for use in physical vapor deposition coating of compressor airfoils with TiN or similar erosion resistant coatings.

Key features of the fixture of this invention include among others: a vertically arranged cylindrical fixture that holds from about 12 or less to about 36 or more, preferably about 18 to about 30, more preferably about 22 to about 26, elongated flat panel fixtures; panel members are designed to securely hold from 1 to about 4 or more rows, preferably 2 rows, of from about 5 or less to about 25 or greater, preferably about 10 to about 20, more preferably about 10 to about 15 airfoils and to mask the dovetail; panel members allow easy mix and match of similar sized but different part types in one coating run; vertical arrangement of airfoils minimizes the exposure to dust before and during coating; staggered airfoil arrangement minimizes the coating loss by self shadowing; precision masking of the dovetail is accomplished by precision machined masks and additional shields; locking of parts with a circumferential dovetail is accomplished by a moveable clamp plate; locking of parts with a ledge type dovetail is accomplished by a drop-in sandwich type concept; and panels are designed such as to enable aqueous cleaning or vapor degreasing after assembly thereby eliminating the need for human contact with the parts after cleaning.

The coating fixture depicted in FIG. 1 shows a cylindrical support structure 14 with panel members 13 aligned in a vertical direction around the outer periphery of the cylindrical support structure 14. FIG. 1 shows a circular base member 10, circular top member 11 and structural members 12, i.e., rod-like members, joining the circular base member 10 to the circular top member 11. The circular top member 11 in FIG. 1 includes a means for receiving an end of said panel members 13 and the base member 10 also includes a means for receiving an end of said panel members 13, thereby securing the panel members 13 to the support structure 14. In an embodiment, the top member 11 can include a raised lip or ledge for receiving the panel member 13 that can include a hooked end permitting it to fit onto the raised lip or ledge. The base member 10 can include a groove for receiving an end of said panel members 13. Other suitable means for affixing panel members 13 to the cylindrical support structure 14 may include hooks, bolts, nuts, screws, wire, clips, pins and the like. Conventional securing means may be employed with the panel members 13 and cylindrical support structure 14. The coating fixture can contain from about 12 or less to about 36 or greater panel members 13 depending on the size of the coating fixture and the size of the panel members 13.

Figure 4:
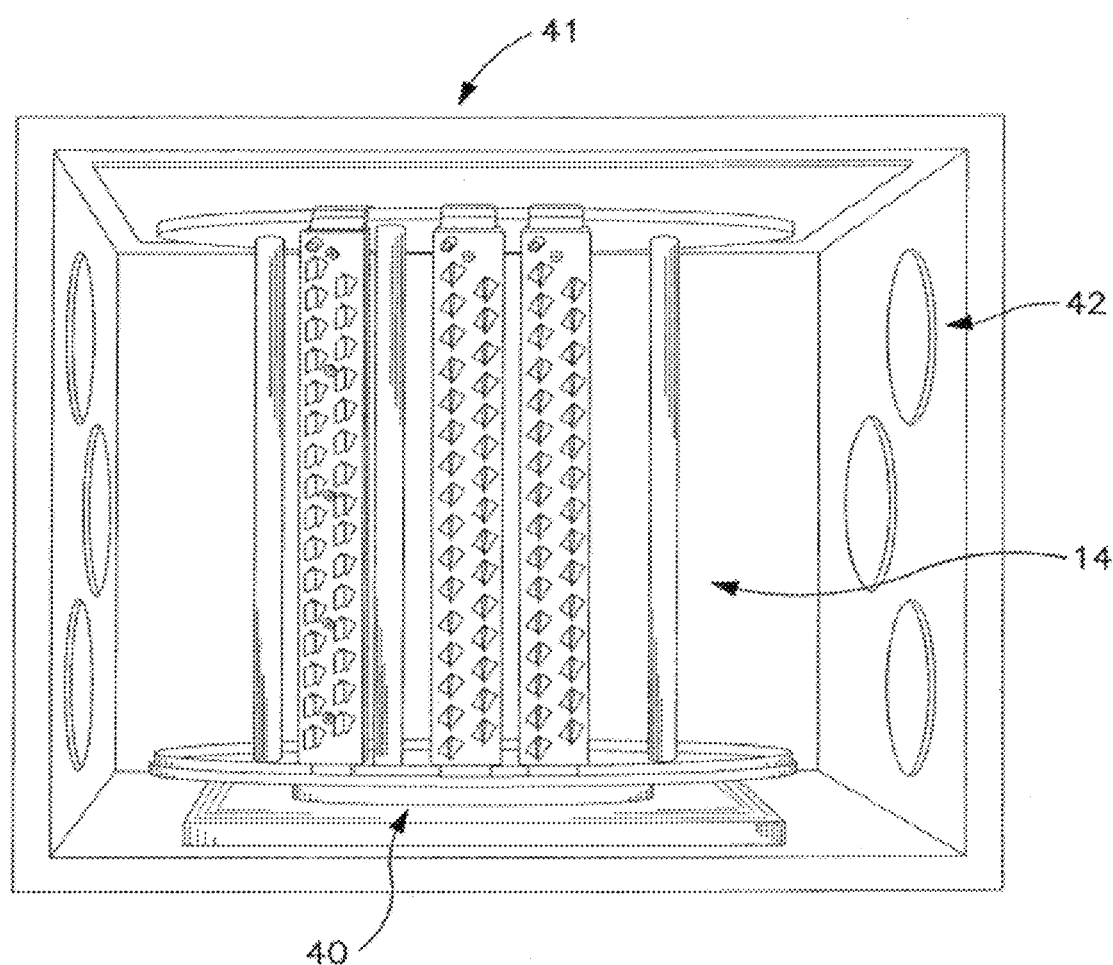
FIG. 4 is a side view of a portion of a fixture positioned on a rotary table in a coating chamber.

The size of the fixture is not narrowly critical and can vary over a wide range. However, as depicted in FIG. 4, the fixture should be of appropriate size so as to permit its positioning onto a rotatable drive system 40 in a coating chamber 41 and to permit the drive system 40 to be operated, thereby allowing the fixture to rotate. The circumference of the fixture can typically range from about 75 centimeters or less to about 250 centimeters or greater, preferably from about 90 to about 200 centimeters, and more preferably from about 90 to about 125 centimeters. The diameter of the fixture can typically range from about 20 centimeters or less to about 100 centimeters or greater, preferably from about 25 to about 75 centimeters, and more preferably from about 30 to about 50 centimeters. The height of the fixture can typically range from about 20 centimeters or less to about 100 centimeters or greater, preferably from about 25 to about 75 centimeters, and more preferably from about 30 to about 50 centimeters.

Figure 2:
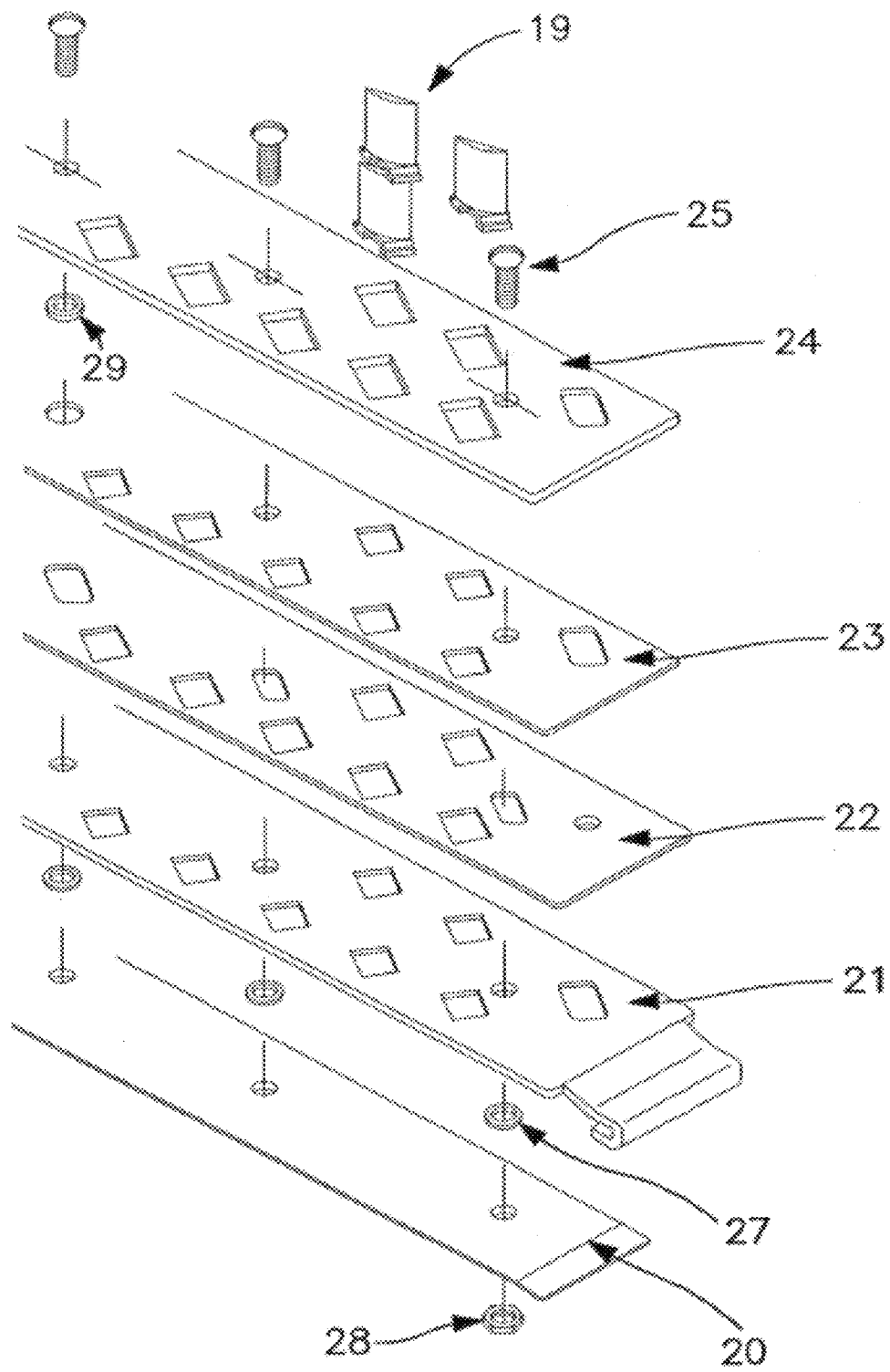
FIG. 2 is an exploded view of a portion of a panel member used for coating rotor blades.

As shown in FIG. 2, the panel members useful for coating rotor blades 19 comprise (i) a base mask plate member 20 having no apertures for holding said workpieces 19, said base mask plate member 20 providing a base barrier for segregating the internal volume of said apertures from the volume external to said apertures, (ii) a base plate member 21 having a plurality of apertures for holding said workpieces 19, said base plate member 21 positioned above said base mask plate member 20, (iii) a clamp plate member 22 having a plurality of apertures for holding said workpieces 19, said apertures being aligned with the apertures of said base plate member 21, said clamp plate member 22 positioned above said base plate member 21, and said clamp plate member 22 providing a top barrier for segregating the internal volume of said apertures from the volume external to said apertures and securing said workpieces 19 in said apertures, (iv) a rotor blade support plate member 23 having a plurality of apertures for holding said workpieces 19, said apertures being aligned with the apertures of said base plate member 21 and clamp plate member 22, said rotor blade support plate member 23 positioned above said clamp plate member 22, (v) a rotor blade mask plate member 24 having a plurality of apertures for holding said workpieces 19, said apertures being aligned with the apertures of said base plate member 21, clamp plate member 22 and rotor blade support plate member 23, said rotor blade mask plate member 24 positioned above said rotor blade support plate member 23, and (vi) fastening means 25, 27, 28 and 29 for securing together said base mask plate member 20, base plate member 21, clamp plate member 22, rotor blade support plate member 23 and rotor blade mask plate member 24.

Illustrative fastening means for securing together said base mask plate member 20, base plate member 21, clamp plate member 22, rotor blade support plate member 23 and rotor blade mask plate member 24 include, for example, screws, spacers, nuts, and the like as shown in FIG. 2. Other suitable fastening means may include bolts, pins, wire, clips and the like. Conventional fastening means may be employed with the panel members.

The clamp plate member 22 is important for securing the rotor blade workpieces 19 in the panel members. As shown in FIG. 2, the apertures of said clamp plate member 22 are removably interlockable with the apertures of said base plate member 21 and said rotor blade support plate member 23. The clamp plate member 22 includes a fastening means aperture that is larger than the fastening means aperture of the base plate member 21 and rotor blade support plate member 23, thereby allowing the clamp plate member 22 to be adjusted to secure the rotor blade workpieces 19 in the panel members.

The size of the panel members useful for coating rotor blades is not narrowly critical and can vary over a wide range. However, the panel members should be of appropriate size so as to permit their positioning and securing to the support structure. The panel members can typically range in length from about 20 centimeters or less to about 100 centimeters or greater, preferably from about 25 to about 75 centimeters, and more preferably from about 30 to about 50 centimeters. The panel members can typically range in width from about 2 centimeters or less to about 10 centimeters or greater, preferably from about 2 to about 6 centimeters, and more preferably from about 2 to about 5 centimeters. The panel members can typically range in thickness from about 0.1 centimeter or less to about 1 centimeter or greater, preferably from about 0.2 to about 0.6 centimeters, and more preferably from about 0.2 to about 0.5 centimeters.

Figure 3:
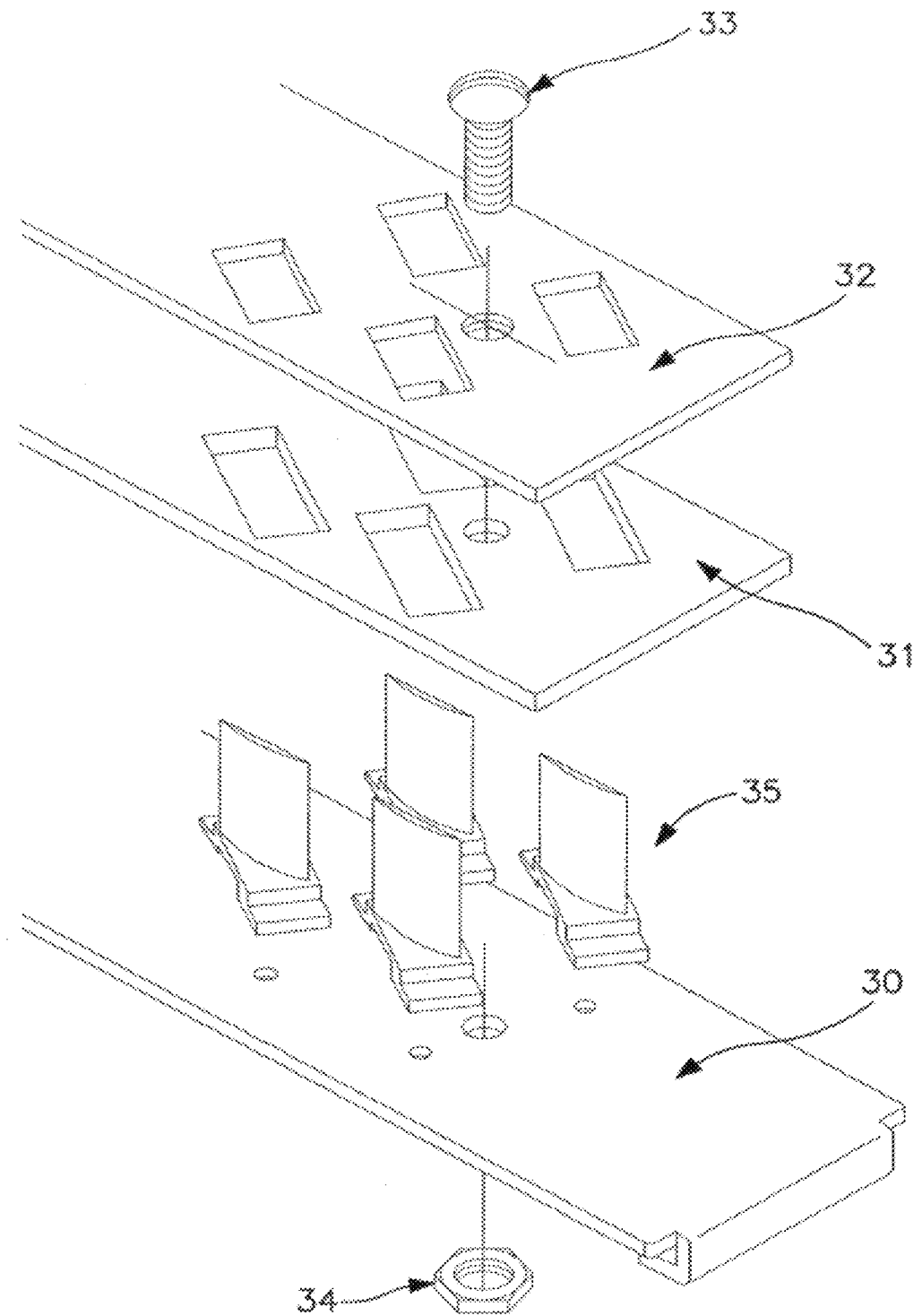
FIG. 3 is an exploded view of a portion of a panel member used for coating stator vanes.

As shown in FIG. 3, the panel members useful for coating stator vanes 35 comprise (i) a base plate member 30 having no apertures for holding said workpieces 35, said base plate member 30 providing a base barrier for segregating the internal volume of said apertures from the volume external to said apertures, (ii) a root mask plate member 31 having a plurality of apertures for holding said workpieces 35, said root mask plate member 31 positioned above said base plate member 30, (iii) a masking plate member 32 having a plurality of apertures for holding said workpieces 35, said apertures being aligned with the apertures of said root mask plate member 31, said masking plate member 32 positioned above said root mask plate member 31, and said root mask plate member 31 and said masking plate member 32 providing a top barrier for segregating the internal volume of said apertures from the volume external to said apertures and securing said workpieces 35 in said apertures, and (iv) fastening means 33 and 34 for securing together said base plate member 30, root mask plate member 31 and masking plate member 32.

Illustrative fastening means for securing together said base plate member 30, root mask member 31 and masking plate member 32 include, for example, screws, spacers, nuts, and the like as shown in FIG. 3. Other suitable fastening means may include bolts, pins, wire, clips and the like. Conventional fastening means may be employed with the panel members.

The size of the panel members useful for coating vanes is not narrowly critical and can vary over a wide range. However, the panel members should be of appropriate size so as to permit their positioning and securing to the support structure. The panel members can typically range in length from about 20 centimeters or less to about 100 centimeters or greater, preferably from about 25 to about 75 centimeters, and more preferably from about 30 to about 50 centimeters. The panel members can typically range in width from about 2 centimeters or less to about 10 centimeters or greater, preferably from about 2 to about 6 centimeters, and more preferably from about 2 to about 5 centimeters. The panel members can typically range in thickness from about 0.1 centimeters or less to about 1 centimeter or greater, preferably from about 0.2 to about 0.6 centimeters, and more preferably from about 0.2 to about 0.5 centimeters.

The panel members allow easy mix and match of similar sized but different workpiece types in one coating run. For example, the fixture may include some panel members with gas turbine compressor rotor blades and other panel members with gas turbine compressor stator vanes. Preferably, each panel member contains all the same workpieces. The design of the coating fixtures of this invention enables efficient coating of a large number of airfoils with high productivity and yield. First time coating yield is very high because of minimized coating defects caused by particulate contamination. This high yield is accomplished through a vertical optimized airfoil orientation as described below.

Figure 5:
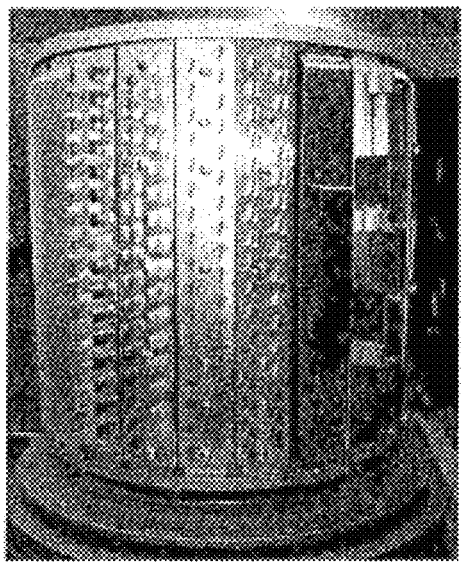
FIG. 5 is a photograph of a coating fixture showing a cylindrical support structure and panel members secured thereto.
Figure 6:
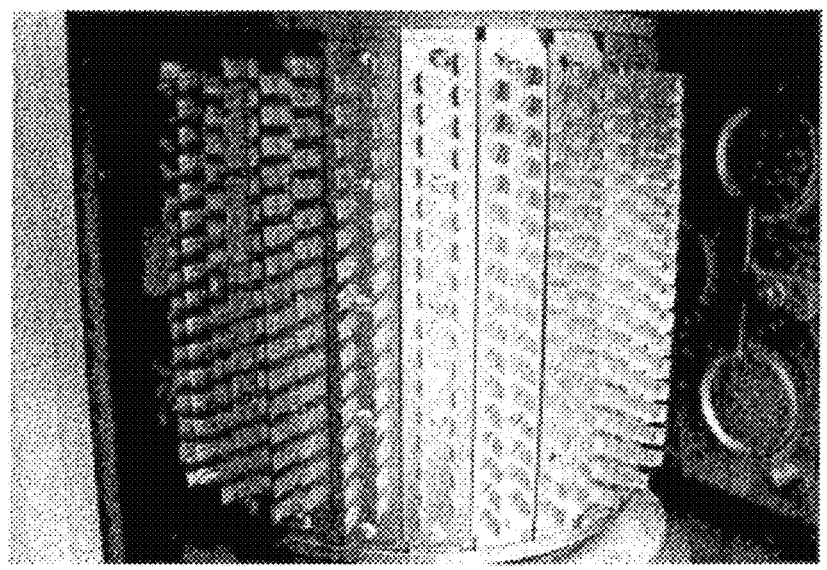
FIG. 6 is a photograph of a coating fixture showing panel members secured thereto.
Figure 7:
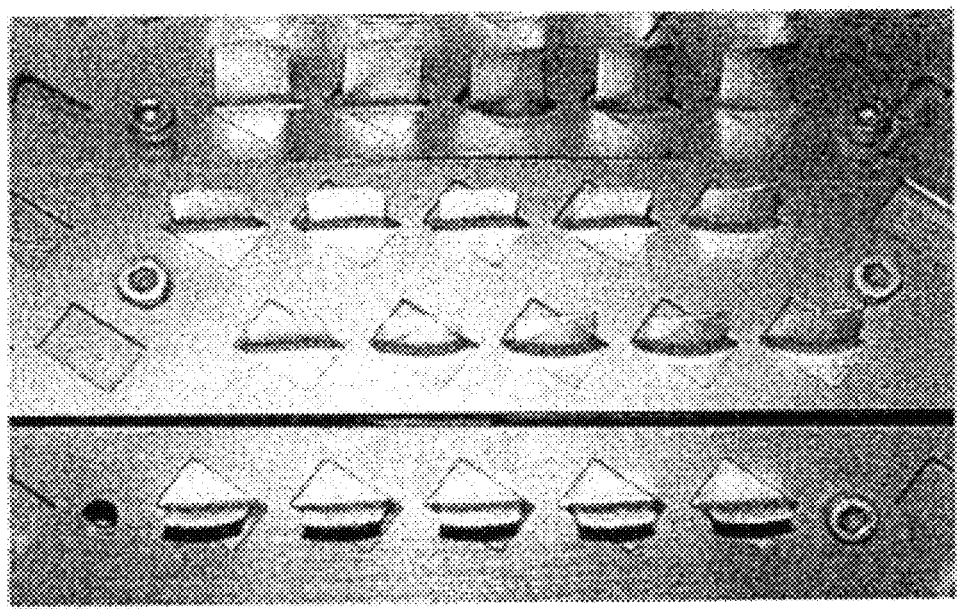
FIG. 7 is a photograph of a portion of a panel member showing a staggered airfoil arrangement.

The coating fixture orients the airfoils with the tip facing outward on a cylindrical surface as shown in FIGS. 1, 5 and 6. To provide the flexibility to mix and match airfoils in one coating run, airfoils of the same part type are grouped on part specific panel members which are affixed to a cylindrical support structure. A panel member can hold typically from 1 to about 4 or more rows, each row containing from about 5 or less to about 25 or more apertures for holding workpieces. The airfoils are oriented vertically so as to minimize the collection of dust on the surface and thereby prevent coating defects. The airfoils are preferably spaced and arranged so as to maximize the coating build up and to minimize self shadowing. This is achieved by airfoil row spacing and a staggered airfoil arrangement as described herein and as shown in FIG. 7.

In the coating fixtures of this invention, the dovetail is masked against coating build-up which, if not masked, would otherwise lead to wear issues and to undesired dimensional issues in the rotor/stator assembly process. All masking plates are precision machined to provide precision masking of the dovetail with minimum overspray.

Additionally, as described below, all fixtures are designed so as to allow aqueous cleaning or vapor degreasing after assembly by arranging appropriated draining holes for the cleaning liquid. This concept ensures no contact with the surface to be coated after final cleaning.

The number of apertures for holding workpieces on a panel member is not narrowly critical and can vary over a wide range depending on the type and size of the cathodic arc coating equipment used, as well as the size of the airfoils. A panel member typically has from 1 to about 4 rows or more, preferably 2 rows, of apertures for holding workpieces, each row having from about 5 or less to about 25 or more apertures depending on the size of the workpieces. Preferably, a panel member has 2 rows of from about 5 to about 20 apertures for holding workpieces.

The fixture of this invention permits the coating of workpieces, such as gas turbine compressor rotor blades and stator vanes, which can have various dovetail designs or configurations, such as circumferential, ledge, axial and others. With respect to the dovetail design or configuration of airfoils, the dovetail needs to be masked against coating build-up so as to prevent wear issues and undesired dimensional issues in the rotor/stator assembly process. In accordance with this invention, the panel members for airfoils with a circumferential or axial dovetail, typically rotor blades, are designed as a multilayer sheet metal construction consisting of a masking plate 24, rotor blade support plate 23, clamp plate 22, base plate 21 and base masking plate 20 as shown in FIG. 2. The panel members for airfoils with an axial dovetail may be designed to include a mounting block which also acts as a dovetail mask. The panel members for airfoils with a dovetail with a ledge, typically stator vanes, are designed as a multilayer sheet metal construction consisting of a masking plate 32, root mask plate 31 and base plate 30 as shown in FIG. 3. All masking plates are precision machined to provide precision masking of the dovetail with minimum overspray.

As indicated above, in a preferred embodiment of this invention, the coating fixture comprises a cylindrical drum composed of vertically arranged panel members. Another variation of this invention is to compose a cylinder by vertically stacked circular or ring-shaped panel members. This variation would arrange the airfoils in the same way as in the panel member embodiment and would also allow also mixing and matching of workpieces.

In accordance with this embodiment, this invention relates to a fixture for use in a coating operation which comprises: a support structure comprising a circular base member, a circular top member opposite the circular base member, and a plurality of structural members joining said top member to said base member; a plurality of circular panel members aligned in a horizontal direction around the outer periphery of said support structure forming a cylinder-like structure; said panel members including a plurality of apertures for holding workpieces to which a coating is to be applied, said apertures facing outwardly away from said support structure, and said apertures configured for receiving a portion of said workpieces that does not require coating; said panel members comprising a plurality of plate members, at least some of said plate members providing a barrier for segregating the internal volume of said apertures from the volume external to said apertures and for securing said workpieces in said apertures; and said apertures positioned on said panel members so that said workpieces are aligned in a horizontal direction and a portion of the workpieces that requires coating extends into the volume external to said apertures and a portion of the workpieces that does not require coating is maintained within the internal volume of said apertures, so that there is essentially no direct communication between the internal volume of the apertures and the external volume of the apertures across said barrier.

The size of the circular panel members useful for coating blades is not narrowly critical and can vary over a wide range. However, the circular panel members should be of appropriate size so as to permit their positioning and securing to the support structure. The circular panel members can typically range in circumference from about 75 centimeters or less to about 250 centimeters or greater, preferably from about 80 to about 200 centimeters, and more preferably from about 90 to about 150 centimeters. The circular panel members can typically range in width from about 2 centimeters or less to about 10 centimeters or greater, preferably from about 2 to about 6 centimeters, and more preferably from about 2 to about 5 centimeters.

The number of apertures for holding workpieces on a circular panel member is not narrowly critical and can vary over a wide range. A circular panel member typically has from 1 to about 4 rows or more, preferably 2 rows, of apertures for holding workpieces, each row having from about 12 or less to about 200 or more apertures depending on the size of the workpieces. Preferably, a circular panel member has 2 rows of from about 12 to about 100 apertures for holding workpieces.

In the embodiment involving circular panel members, the circular top member of the support structure may include a means for receiving a side of said circular panel members and the base member may also include a means for receiving a side of said circular panel members, thereby securing the circular panel members to the support structure. In an embodiment, the top member and base member can include a groove for receiving a side of said circular panel members. Other suitable means for affixing circular panel members to the cylindrical support structure may include bolts, nuts, screws, pins, wire, clips and the like. Conventional securing means may be employed with the circular panel members and support structure.

As with the vertically arranged panel members, the airfoils on circular panel members are oriented vertically so as to minimize the collection of dust on the surface and thereby prevent coating defects. The airfoils are preferably spaced and arranged so as to maximize the coating build up and to minimize self shadowing. This is achieved by airfoil row spacing and a staggered airfoil arrangement as described herein and as shown in FIG. 7.

The components of the coating fixture of this invention may be formed from any suitable material known in the art. However, the fixture material should be electrically conductive so as to provide current flow to the workpieces to be coated in the ion etching and plating process steps of the coating operation. For example, all the components of the cylindrical support structure as well as all the components of the panel members, may be formed from a metallic material such as stainless steel, e.g., SST 304 and Inconel.

All fixtures are designed so as to enable aqueous cleaning or vapor degreasing after assembly by arranging appropriated draining holes for the cleaning liquid. This concept ensures no contact with surface to be coated after final cleaning. Particularly, the fixture is designed such that it allows easy draining of apertures of an aqueous cleaning solution. This enables cleaning of the fixture assembly after fixturing the workpieces to remove any contamination on the surface of the workpieces. Surface contamination of the workpieces can be introduced during fixturing by human contact and the like. Preferably, the base plate member used in panel members for coating vanes as depicted in FIG. 3 has a plurality of draining holes for removal of the aqueous cleaning solution.

As also indicated above, this invention relates to a method for simultaneously coating a plurality of workpieces comprising: (i) providing a fixture (ii) loading and securing workpieces into said apertures of said panel members 13; (iii)

positioning said fixture onto a rotatable drive system 40 in a coating chamber 41 having a source of coating material; and (iv) operating the drive system 40 to cause the fixture to rotate and simultaneously coating by physical vapor deposition that portion of said workpieces that extends into the volume external of said apertures.

In this embodiment, the fixture comprises: a support structure 14 comprising a circular base member 10, a circular top member 11 opposite the circular base member 10, and a plurality of structural members 12 joining said top member 11 to said base member 10; a plurality of panel members 13 aligned in a vertical direction around the outer periphery of said support structure 14 forming a cylinder-like structure, said panel members 13 secured on said circular top member 11 and said circular base member 10; said panel members 13 including a plurality of apertures for holding workpieces to which a coating is to be applied, said apertures facing outwardly away from said support structure, and said apertures configured for receiving a portion of said workpieces that does not require coating; said panel members 13 comprising a plurality of plate members, at least some of said plate members providing a barrier for segregating the internal volume of said apertures from the volume external to said apertures and for securing said workpieces in said apertures; and said apertures positioned on said panel members 13 so that said workpieces are aligned in a vertical direction and a portion of the workpieces that requires coating extends into the volume external to said apertures and a portion of the workpieces that does not require coating is maintained within the internal volume of said apertures so that there is essentially no direct communication between the internal volume of the apertures and the external volume of the apertures across said barrier;

As depicted in FIG. 4, the fixture is positioned in a physical vapor deposition coating chamber 41 upon a rotatable drive system 40, e.g., rotary table. Arc cathodes 42 are positioned on the side walls of the coating chamber 41. The rotatable drive system 40 is operated causing the fixture to rotate. The workpieces are simultaneously coated by physical vapor deposition.

FIG. 6 shows a fixture filled with panel members with each panel member filled with workpieces.

Physical vapor deposition in the coating chamber can be conducted by conventional methods known in the art. See, for example, U.S. Pat. No. 5,071,693, the disclosure of which is incorporated herein by reference. Illustrative erosion resistant coating system that can be used with the coating fixtures of this invention include TiN, TiCN, TiZrN, TiZrCN, TiAlN, TiAlCN, and the like. Physical vapor deposition can be used to apply the erosion resistant coatings by reactive evaporation or sputtering, for example, by cathodic arc evaporation, hollow cathode reactive electron beam evaporation, reactive sputtering, and the like.

To provide the maximum coating thickness on the workpieces such as the lower part of the airfoil and on the platform, the view between the cathode surface and the workpiece surfaces should not be obstructed. In the preferred arrangement of vertically aligning the workpieces in rows on panels and on a rotating fixture, the workpieces can shadow themselves if the rows are spaced too closely. This self shadowing can be minimized, when the rows are spaced sufficiently wide to allow vapor reach the workpieces in a row without obstruction of the vapor flux by the workpieces in a neighboring row.

To further enhance the vapor flux to the platforms and lower parts of the airfoil of the workpieces, it is advantageous to space the workpieces in vertical direction and to stagger the workpieces location from row to row such that the vapor can pass through the workpieces of one row and can reach the platform and lower parts of the airfoils of the staggered workpieces in the next row.

In a preferred embodiment, row spacing of one to two times of the airfoil length (platform to tip), a workpiece spacing in vertical direction of one to two times of the chord width of the airfoil, and an alternating staggered arrangement of the workpieces in the rows can provide basically the same deposition rate at the platform and lower parts of the airfoil of the workpiece as a free standing workpiece without any self shadowing.

In an embodiment of this invention, a multilayer nitride-containing coating is produced on the workpieces by a method comprising:

(a) placing a fixture containing the workpieces to be coated on a rotatable drive system 40 in a chamber 41, said fixture comprising:

a support structure 14 comprising a circular base member 10, a circular top member 11 opposite the circular base member 10, and a plurality of structural members 12 joining said top member 11 to said base member 10;

a plurality of panel members 13 aligned in a vertical direction around the outer periphery of said support structure 14 forming a cylinder-like structure, said panel members 13 secured on said circular top member 11 and said circular base member 12;

said panel members 13 including a plurality of apertures for holding workpieces to which a coating is to be applied, said apertures facing outwardly away from said support structure, and said apertures configured for receiving a portion of said workpieces that does not require coating;

said panel members 13 comprising a plurality of plate members, at least some of said plate members providing a barrier for segregating the internal volume of said apertures from the volume external to said apertures and for securing said workpieces in said apertures; and said apertures positioned on said panel members 13 so that said workpieces are aligned in a vertical direction and a portion of the workpieces that requires coating extends into the volume external to said apertures and a portion of the workpieces that does not require coating is maintained within the internal volume of said apertures, so that there is essentially no direct communication between the internal volume of the apertures and the external volume of the apertures across said barrier;

(b) adding to the chamber 41 a titanium based target and a nitrogen-containing gas mixture;

(c) operating said drive system 40 to cause the fixture to rotate and simultaneously evaporating the titanium from the titanium-based target to produce a titanium vapor to react with the nitrogen in the nitrogen-containing gas mixture to form a titanium nitride-containing layer of a desired nitrogen content on that portion of the workpieces that extends into the volume external of said apertures;

(d) changing the ratio of nitrogen to titanium in step (c) to form another titanium nitride-containing layer on the coated workpieces that has a nitrogen content of at least 2 atomic percent of nitrogen different than the nitrogen contained in the previously deposited coating; and (e) repeating step (d) at least once to form a multilayer coating of at least two layers in which at least one layer contains at least 2 atomic percent of nitrogen different than the nitrogen contained in an adjacent layer. The ratio of nitrogen to titanium can be changed by altering the current, changing the flow of nitrogen or a combination of both.

In another embodiment of this invention, a multilayer nitride-containing coating is produced on the workpieces by a method comprising:

(a) placing a fixture containing the workpieces to be coated on a rotatable drive system 40 in a vapor deposition chamber 41, said fixture comprising:

a support structure 14 comprising a circular base member 10, a circular top member 11 opposite the circular base member 10, and a plurality of structural members 12 joining said top member 11 to said base member 10;

a plurality of panel members 13 aligned in a vertical direction around the outer periphery of said support structure 14 forming a cylinder-like structure, said panel members 13 secured on said circular top member 11 and said circular base member 10;

said panel members 13 including a plurality of apertures for holding workpieces to which a coating is to be applied, said apertures facing outwardly away from said support structure, and said apertures configured for receiving a portion of said workpieces that does not require coating;

said panel members 13 comprising a plurality of plate members, at least some of said plate members providing a barrier for segregating the internal volume of said apertures from the volume external to said apertures and for securing said workpieces in said apertures; and said apertures positioned on said panel members 13 so that said workpieces are aligned in a vertical direction and a portion of the workpieces that requires coating extends into the volume external to said apertures and a portion of the workpieces that does not require coating is maintained within the internal volume of said apertures, so that there is essentially no direct communication between the internal volume of the apertures and the external volume of the apertures across said barrier;

(b) adding to the vapor deposition chamber 41 an anode and a titanium-based cathode along with a nitrogen-containing gas mixture;

(c) operating said drive system 40 to cause the fixture to rotate and simultaneously applying a voltage across the cathode and anode to establish a current to effect evaporation of the titanium from the titanium-based cathode to produce a titanium vapor to react with the nitrogen in the nitrogen-containing gas mixture to form a titanium nitride-containing layer of a desired nitrogen content on that portion of the workpieces that extends into the volume external of said apertures;

(d) changing the ratio of nitrogen to titanium in step (c) to form another titanium nitride-containing layer on the coated workpieces that has a nitrogen content of at least 2 atomic percent of nitrogen different than the nitrogen contained in the previously deposited coating; and (e) repeating step (d) at least once to form a multilayer coating of at least two layers in which at least one layer contains at least 2 atomic percent of nitrogen different than the nitrogen contained in an adjacent layer. The ratio of nitrogen to titanium can be changed by altering the current, changing the flow of nitrogen or a combination of both.

Preferably, the nitrogen-containing gas mixture can be argon-nitrogen, krypton-nitrogen, helium-nitrogen, xenon-nitrogen, neon-nitrogen, and the like.

The nitride-containing compound of each layer may have an atomic percent of nitrogen from 33% to 55%, preferably from 40% to 50%, and more preferably from 42% to 50%. The nitride-containing compound of an adjacent layer may have an atomic percent of nitrogen from 33% to 45%, and preferably from 39% to 42%. The nitrogen content in one layer should be at least 2 atomic percent of nitrogen different than the nitrogen content in an adjacent layer. The multilayer coating can be deposited by using conventional process techniques such as physical vapor deposition. The changing of the ratio of nitrogen to titanium for the alternate lamellare layers will interrupt the grain growth process of the coating compound so that the grain size of the compound is no larger than the thickness of the individual layers.

The preferred coating can comprise a layer of titanium nitride having an atomic percent of nitrogen from 40% to 55% alternating with a layer of titanium nitride having an atomic percent of nitrogen from 33% to 45% and wherein at least one layer has at least 2 atomic percent of nitrogen different than the nitrogen content in each adjacent layer on opposite sides of such layer. Titanium nitride with the above ranges of nitrogen can have the same orientation and crystallographic structure with a small difference in lattice spacings so that coherent interfaces between the layers can be expected to produce a high toughness characteristic.

The coating fixture of this invention facilitates the deposition of high quality and evenly distributed coatings. Hardness and toughness of a multilayer coating are closely related to compositions and spacings of layers. The individual layer thickness and overall thickness of the multilayer coating depends on specific applications. For systems applications requiring high toughness, the layer with the smaller content of nitrogen should be from 1 to 20 times thicker than the layer containing the higher content of nitrogen. An overall coating thickness of from 5 microns up to 30 microns thick is generally adequate for most erosion applications.

The thickness of the individual layers can vary greatly, for example, between 0.1 and 5 microns thick, preferably about 1 micron thick. The number of layers should be at least two so that at least one layer will have an atomic percent of nitrogen of 2% more or 2% less than the nitrogen content in the adjacent layer. The number of layers of a nitride-containing compound forming the coating can vary from two up to any number desired for a particular application. Generally, 5 to 50 layers, preferably 15 to 40 layers, of the coating would be suitable for most applications.

In some applications, it may be advisable to have a relatively thick first layer of the nitride-containing compound to support subsequent multilayers of the coating and/or a thick top layer to provide a harder top surface. The multilayer coating is ideally suited for coating workpieces made of materials such as titanium, steel, aluminum, nickel, cobalt, alloys thereof, and the like.

In another embodiment, this invention relates to multilayer coated workpieces, e.g., rotor blades and stator vanes, that are coated with at least two layers of a nitride-containing compound with each layer containing at least one additive from the group comprising titanium, zirconium, titanium alloys and zirconium alloys and wherein at least one layer contains at least 2 atomic percent of nitrogen different than the nitrogen contained in the adjacent layer. The layer can also contain at least one element from the group comprising aluminum, vanadium, molybdenum, niobium, iron, chromium and manganese. Preferably, the multilayer coated workpiece will comprise three or more layers in which at least one layer will contain at least 2 atomic percent of nitrogen different than the nitrogen contained in each of the adjacent layers. Various modifications and variations of this invention will be obvious to a worker skilled in the art and it is to be understood that such modifications and variations are to be included within the purview of this application and the spirit and scope of the claims.

Examples

Multilayer titanium nitride coatings were deposited on rotor blade and stator vane workpieces using the coating fixture shown in FIG. 6 and a physical vapor deposition arc evaporation process. Panel members were loaded with rotor blades or stator vanes and then secured on the cylindrical support structure of the coating fixture. The coating fixture was then placed in a vapor deposition chamber. Before deposition, the vapor deposition chamber was evacuated to a pressure below $7\times10^{-4}$ Pa and then backfilled with argon to 0.7 Pa. The rotor blade and stator vane workpieces to be coated were sputtered to remove surface contaminants. The coating fixture was rotated at about 1-10 rotations per minute during the coating process. Subsequently, a direct current arc was activated across a titanium cathode and a chamber which acts as an anode to evaporate Ti from the Ti cathode in an argon-$N_2$ gas mixture at an overall pressure between 1.3 to 4.8 Pa. The ionized Ti vapor reacted with $N_2$ ions and then formed titanium nitride coatings on the workpieces. The layered structure of the coating was formed by altering the $N_2$ gas flow rates during the deposition. Typically, the coating consisted of a lamellar structure of A and B nitride layers in which the thickness of the B layer was greater than that of the A layer. The nitrogen concentration in the A layer was generally greater than the nitrogen content in the B layer. The deposition produced a multilayer coating of 15 alternating A and B layers. The resulting thickness of the coating at the airfoil close to the tip was about 17-20 microns, at the airfoil close to the platform was about 7-9 microns, and on the platform was about 9-10 microns.

What is claimed is:

1. A method for simultaneously coating a plurality of workpieces comprising:
   (i) providing a fixture;
   (ii) loading and securing workpieces into a plurality of apertures of a plurality of panel members;
   (iii) positioning said fixture onto a rotatable drive system in a coating chamber having a source of coating material; and
   (iv) operating the drive system to cause the fixture to rotate and simultaneously coating by physical vapor deposition that portion of said workpieces that extends into the volume external of said apertures,
   wherein the fixture comprises a support structure comprising a circular base member, a circular top member opposite the circular base member, and a plurality of structural members joining said top member to said base member;
   wherein said panel members aligned in a vertical direction around the outer periphery of said support structure form a cylinder structure, said panel members secured on said circular top member and said circular base member;
   wherein said panel members include said apertures for holding workpieces to which a coating is to be applied, said apertures facing outwardly away from said support structure, and said apertures are configured for receiving a portion of said workpieces that does not require coating;
   wherein said panel members comprise a plurality of plate members, at least some of said plate members providing a barrier for segregating the internal volume of said plurality of apertures from the volume external to said apertures and for securing said workpieces in said apertures; and
   wherein said apertures positioned on said panel members are located so that said workpieces are aligned in a vertical direction and a portion of the workpieces that requires coating extends into the volume external to said apertures and a portion of the workpieces that does not require coating is maintained within the internal volume of said apertures so that there is essentially no direct communication between the internal volume of said apertures and the external volume of said apertures across said barrier.

2. The method of claim 1 wherein said circular base member comprises a circular band member, said circular top member comprises a circular band member, and said structural members comprise rod members.

3. The method of claim 1 wherein said top member includes a means for receiving an end of said panel members and said base member includes a means for receiving an end of said panel members, thereby securing said panel members to said support structure.

4. The method of claim 1 comprising from about 12 or less to about 36 or more panel members.

5. The method of claim 1 comprising panel members having from 1 to about 4 or more rows in which each row comprises from about 5 or less to 25 or more apertures for holding workpieces.

6. The method of claim 1 wherein said apertures are positioned on said panel members so that said workpieces are aligned in a staggered vertical direction.

7. The method of claim 1 wherein said panel members include the same workpieces.

8. The method of claim 1 wherein one or more panel members include workpieces different from other panel members.

9. The method of claim 1 wherein said panel members comprises (i) a base mask plate member having no apertures for holding said workpieces, said base mask plate member providing a base barrier for segregating the internal volume of said apertures from the volume external to said apertures, (ii) a base plate member having a plurality of apertures for holding said workpieces, said base plate member positioned above said base mask plate member, (iii) a clamp plate member having a plurality of apertures for holding said workpieces, said apertures being aligned with the apertures of said base plate member, said clamp plate member positioned above said base plate member, and said clamp plate member providing a top barrier for segregating the internal volume of said apertures from the volume external to said apertures and securing said workpieces in said apertures, (iv) a blade support plate member having a plurality of apertures for holding said workpieces, said apertures being aligned with the apertures of said base plate member and clamp plate member, said blade support plate member positioned above said clamp plate member, (v) a blade mask plate member having a plurality of apertures for holding said workpieces, said apertures being aligned with the apertures of said base plate member, clamp plate member and blade support plate member, said blade mask plate member positioned above said blade support plate member, and (vi) fastening means for securing together said base mask plate member, base plate member, clamp plate member, blade support plate member and blade mask plate member.

10. The method of claim 9 in which the apertures of said clamp plate member is removably interlockable with the apertures of said base plate member and said blade support plate member.

11. The method of claim 9 wherein the workpieces are airfoils having a circumferential dovetail.

12. The method of claim 9 wherein the workpieces are airfoils having an axial dovetail.

13. The method of claim 1 wherein said panel members comprises (i) a base plate member having no apertures for holding said workpieces, said base plate member providing a base barrier for segregating the internal volume of said apertures from the volume external to said apertures, (ii) a root mask plate member having a plurality of apertures for holding said workpieces, said root mask plate member positioned above said base plate member, (iii) a masking plate member having a plurality of apertures for holding said workpieces, said apertures being aligned with the apertures of said root mask plate member, said masking plate member positioned above said root mask plate member, and said root mask plate member and said masking plate member providing a top barrier for segregating the internal volume of said apertures from the volume external to said apertures and securing said workpieces in said apertures, and (iv) fastening means for securing together said base plate member, root mask plate member and masking plate member.

14. The method of claim 13 wherein the workpieces are vanes having a dovetail with a ledge.

15. The method of claim 1 further comprising cleaning said workpieces prior to step (iii).

16. The method of claim 1 wherein said workpieces are coated by physical vapor deposition of an erosion resistant coating system.

17. The method of claim 16 wherein said erosion resistant coating system is selected from TiN, TiCN, TiZrN, TiZrCN, TiAlN and TiAlCN.

* * * * *